United States Patent [19] [11] Patent Number: 4,515,424
Sakurai [45] Date of Patent: May 7, 1985

[54] SUPPORT STRUCTURE FOR IC PACKAGE AND HAVING REMOVABLE CLOSURE

[75] Inventor: Toshihiro Sakurai, Tokyo, Japan

[73] Assignee: Yamaichi Electric Mfg. Co., Ltd., Tokyo, Japan

[21] Appl. No.: 501,394

[22] Filed: Jun. 6, 1983

Related U.S. Application Data

[63] Continuation-in-part of Ser. No. 432,096, Sep. 29, 1982, abandoned.

[51] Int. Cl.³ .............................................. H01R 9/09
[52] U.S. Cl. .............................. 339/75 MP; 16/266; 339/17 CF
[58] Field of Search ............. 339/17 CF, 75 R, 75 M, 339/75 MP; 220/337, 338, 340; 16/260, 265, 266, 229, 380, 386

[56] References Cited
U.S. PATENT DOCUMENTS

| 282,470 | 7/1883 | Shepard et al. | 16/266 |
| 327,319 | 9/1885 | Rockfellow | 16/266 |
| 780,136 | 1/1905 | Sloan | 16/266 |
| 2,346,977 | 4/1944 | La Sha | 16/266 |
| 2,963,734 | 12/1960 | Huget | 16/266 |
| 3,462,179 | 8/1969 | Hinkle | 16/266 |
| 3,471,874 | 10/1969 | Dixon | 16/266 |
| 4,058,890 | 11/1977 | Pierce et al. | 16/266 |

FOREIGN PATENT DOCUMENTS

| 258507 | 11/1967 | Fed. Rep. of Germany | 16/266 |
| 57-83680 | 5/1982 | Japan | 339/17 CF |

Primary Examiner—John McQuade
Attorney, Agent, or Firm—Wenderoth, Lind & Ponack

[57] ABSTRACT

A supporting structure for an IC package which has a socket for receiving an IC package, a cover member rotatably attached to one end of the socket and a locking lever member rotatably attached to the other end of the socket for locking the cover member to the socket when the cover member is in the closed position. A first coupling connects one or the other or both ends of the socket to the cover member and/or the locking lever member so that they can be separated by properly rotationally positioning the cover member or locking lever member and sliding it laterally and axially along the axis of rotation thereof. A second coupling is provided which can be used for connecting one or both of the cover member and/or the locking lever member to the socket along with or in place of the first coupling, the second coupling enabling removal of the cover member or the locking lever member by sliding laterally and transversely of the axis of rotation thereof.

7 Claims, 12 Drawing Figures

SUPPORT STRUCTURE FOR IC PACKAGE AND HAVING REMOVABLE CLOSURE

This application is a continuation-in-part of application Ser. No. 432,096, filed Sept. 29, 1982, now abandoned.

BACKGROUND OF THE INVENTION

The present invention relates to a support structure for an IC package to obtain a reliable electric connection and, more specifically, relates to an IC package support structure utilizing coupling means.

When an electric connection is provided by superposing a flat IC package on an IC socket piece, since the conductors of the IC package are merely laid on the contacts of the IC socket, the superposition of the IC package and the IC socket which is maintained by a lid member provided on the IC socket is the only thing maintaining a reliable contact between the contacts and the conductors.

A conventional lid member disclosed, for example, in Japanese Utility Model Public Disclosure No. Sho 57(1982)-83680, is pivotally permanently attached to an IC socket by inserting a metallic pin into one end of the socket, allowing both sides of the base end of the lid member to admit the two ends of the metallic pin, and calking the ends of the metallic pin. The conventional support structure, therefore, entails the disadvantages that very difficult manipulation is required for attaching the lid member pivotally to the socket piece by preparing and utilizing the metallic pin as a separate part, thereby increasing the number of processes and the manufacturing cost, that there is a fair possibility of the metallic pin being loosened and deformed, thereby preventing the support lid from being smoothly rotated and from fulfilling its function precisely, and that since the support lid cannot be detached from the socket substrate it is necessary to pack up the parts after disassembly and it is difficult to assemble the parts at the scene of installation of the socket.

SUMMARY OF THE INVENTION

One object of the present invention is to provide a support structure for an IC package, which is easy to operate and capable of safely, precisely and firmly supporting the IC package in an IC socket and of providing a reliable electric connection.

To achieve the object described above, according to the present invention, there is provided a support structure for an IC package, which comprises a cover member rotatably attached to one end of an IC socket; a locking lever member rotatably attached to the other end of the socket for locking the cover member; at least two bearing couplings projecting from one end of either the socket or one of the members, and spaced from each other in the direction of the axis of rotation of the one member and each bearing coupling provided with a hole therethrough in the aforementioned direction; at least two shaft couplings projecting from the base end of the other of the socket or the one member and spaced from each other in the direction of the axes of the holes in the bearing couplings and each provided with a shaft which projects from the side thereof in the same direction; at least two keys projecting from the base end of the socket or the member having the shafts thereon and disposed respectively at the free ends of the shafts; the two bearing couplings each having a key groove in the circumferential surface thereof parallel to the axes of the holes and adapted to allow the keys to be slidably fitted therein.

The aforementioned object, and other objects and characteristic features of the present invention will become apparent from the further disclosure of the invention made hereinbelow with reference to the accompanying drawings.

DESCRIPTION OF PREFERRED EMBODIMENTS

Figure 1:
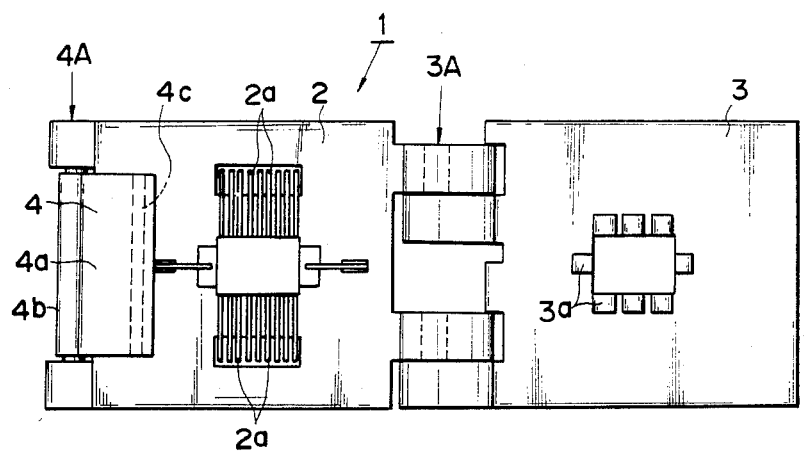
FIG. 1 is a plan view illustrating one embodiment of a support structure for an IC package to be superposed on an IC socket according to the present invention, with a support cover in the open position relative to the IC socket.
Figure 2:
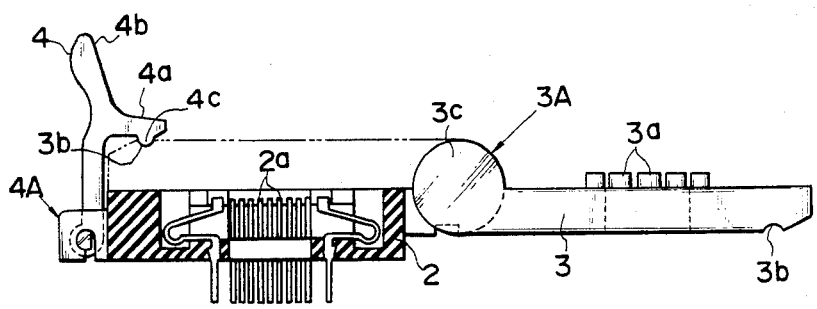
FIG. 2 is a partially cut-away side view of the structure shown in FIG. 1.

The present invention will now be described with reference to the drawings.

An IC package support structure 1 comprises a socket 2 made of an insulating material, provided therein with a plurality of contacts 2a which come into contact with a plurality of conductors of a flat IC package, and having a cover member 3 attached to one end thereof and a locking lever member 4 attached to the other end thereof.

The cover member 3 is shown in FIG. 1 as being pivotally attached to one end of the socket 2 by first coupling means 3A and is provided on one surface thereof with pads 3a. When the cover member 3 is closed relative to the socket 2 having the IC package superposed thereon, it functions to depress the conductors of the IC package toward the contacts 2a of the socket 2 by means of the pads 3a. The locking lever member 4 is rotatably attached to the other end of the socket 2 by second coupling means 4A. When the locking lever member 4 engages with the cover member 3, it functions to forcibly depress the cover member 3 and to lock the same. The locking lever member 4 comprises an engaging lever 4a having a projection 4c and a handle lever 4b. The cover member 3 has a groove 3b formed in the other surface on the free end thereof. By rotating the locking lever member 4 toward the cover member 3 and causing the projection 4c on the locking lever member 4 to come into snap engagement with the groove 3b of the cover member 3, the cover member 3 which has been lifted slightly upwardly by the resiliency of the contacts $2a$ of the IC socket 1 is forcibly depressed against the resiliency of the contacts and locked by the locking lever member 4.

Figure 3:
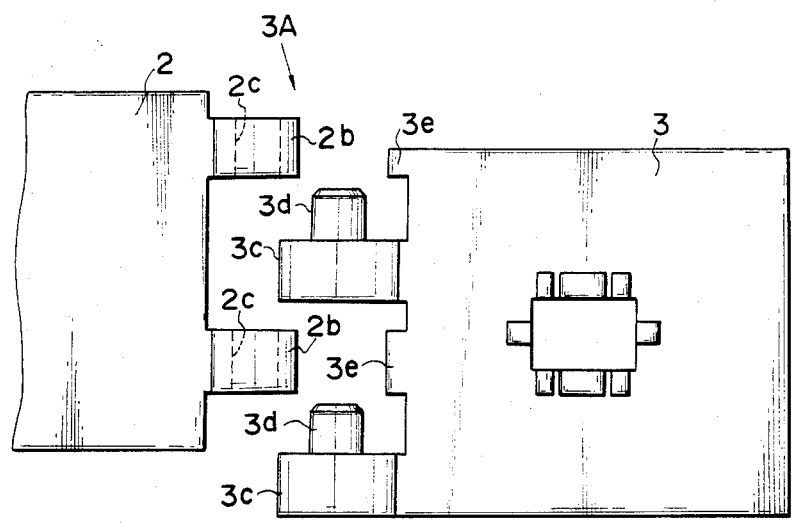
FIG. 3 is a plan view showing one embodiment of first coupling means for coupling the cover member to the IC socket with the parts in a separated state.
Figure 4:
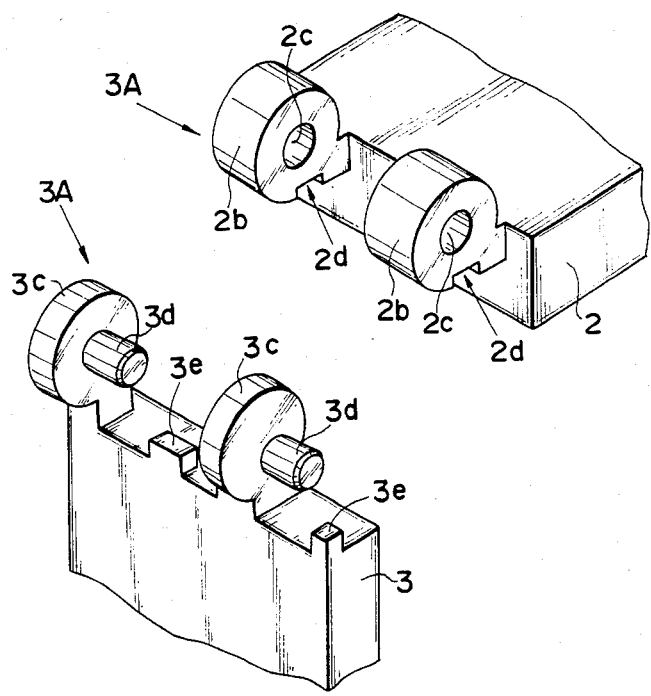
FIG. 4 is an exploded perspective view of the coupling means shown in FIG. 3.

The first coupling means 3A will now be described with reference to FIGS. 3–5. The socket 2 has at least two bearing couplings $2b$ projecting from one end thereof. The bearing couplings $2b$ are spaced from each other in the direction of the axis of roration of cover member 3 and each has through holes $2c$ extending in the direction of axis of rotation of the cover member 3. On the other hand, the cover member 3 has at least two shaft couplings $3c$ projecting from the base end thereof. The shaft couplings $3c$ are separated from each other in the direction of the axis of the through holes $2c$ of the bearing couplings $2b$ and each has a shaft $3d$ projecting from one side thereof, the shafts projecting in the same direction. The cover member 3 is further provided with at least two keys $3e$ which project from the base end thereof and are disposed at the free ends of the shafts $3d$ of the shaft couplings $3c$ respectively. The bearing couplings $2b$ on the socket 2 are further provided on the circumferential surfaces thereof with at least two key grooves $2d$ parallel with the through holes $2c$.

Figure 5A:
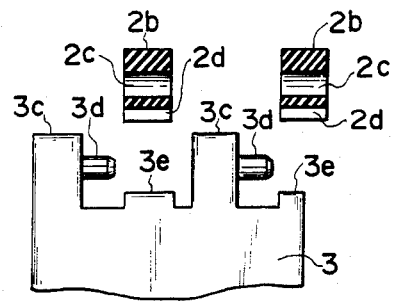
FIGS. 5A, 5B and 5C are explanatory, partially cut-away front views illustrating a process for coupling the cover member and the IC socket substrate by the first coupling means.
Figure 5B:
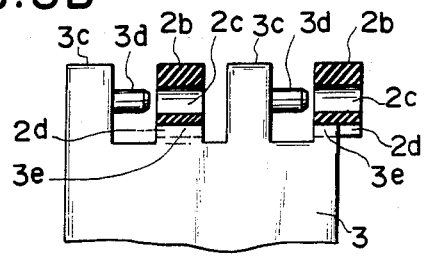
Figure 5C:
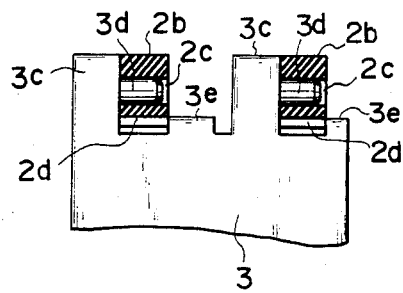

The keys $3e$ are slidably fitted in the key grooves $2d$ with the shafts $3d$ and the bearing couplings $2b$ not interfering with each other as shown in FIG. 5A, thereby aligning the axes of the shafts $3d$ with the axes of the through holes $2c$. Thereafter, either the cover member 3 of the socket 2, or both, are moved laterally with the keys $3e$ and the key grooves $2d$ guiding them and, consequently, the shafts $3d$ are inserted into and accommodated in the through holes $2c$, and the keys $3a$ move out of the key grooves $2d$. At this time, the sides of the shaft couplings $3c$ from which the shafts $3d$ project come into surface contact with the corresponding sides of the bearing couplings $2b$ respectively.

When the cover member 3 is rotated toward the upper surface of the substrate 2 with the keys $3e$ out of the key grooves $2d$, the keys $3e$ come into contact with the sides of the bearing couplings on the opposite side from the shaft couplings $3c$. As a result, the bearing couplings $2c$ are respectively held between the shaft couplings $3c$ and the keys $3e$. The cover member 3 is effectively prevented from being laterally moved due to the interposition of the bearing couplings $2c$ between the shaft couplings $3c$ and the keys $3e$. The shaft couplings $3c$ and the bearing couplings $2b$ are thus united with each other at the normal position of the cover member 3 relative to the substrate 2. That is to say, the cover member 3 is pivotally attached to the socket 2 by the first coupling means 3A. By carrying out the aforementioned steps in reverse, the cover member 3 can easily be removed from the socket 2. If the key grooves $2d$ are formed on the lower sides of the bearing couplings $2b$, in an actual case where the support structure 1 is superposed on a printed board etc., there is no fear that the connection between the shaft couplings $3c$ and the bearing couplings $2b$ can be released because the cover member 3 cannot be rotated sufficiently far away from the socket 2.

As described above, the cover member 3 can be smoothly united with the socket 2 for pivoting thereon by the first coupling means 3A by a simple operation which does not require the conventional calking process for a pin. In this embodiment, the socket 2 and the bearing couplings $2b$ are integrally formed of an insulating material, and the cover member 3 and the shaft couplings $2b$ are also intergrally formed of an insulating material. Therefore, separate parts such as pins used in the conventional pivotal connection are no longer required for constituting the coupling means.

Alternatively, the keys $3e$ and the key grooves $3d$ can be reversed, although this arrangement is not illustrated. To be specific, the keys $3e$ may be formed on the socket 2, and the key grooves $2d$ may be formed in the cover member 3. Similarly, although this is not shown, the shaft couplings $3c$ and bearing couplings $2b$ can be reversed, that is, the shaft couplings $3c$ may be formed integrally with the socket 2, whereas the bearing couplings $2c$ may be formed integrally with the cover member 3.

Figure 6:
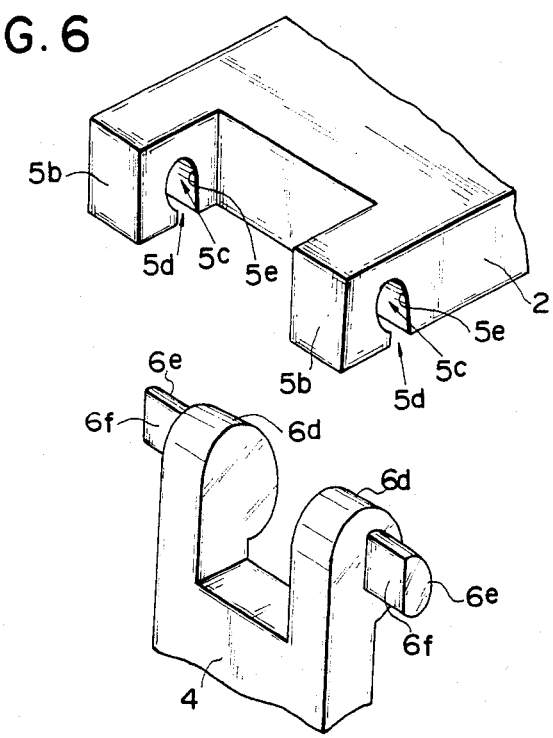
FIG. 6 is an exploded perspective view showing a coupling means for coupling a locking lever member and the IC socket.
Figure 7A:
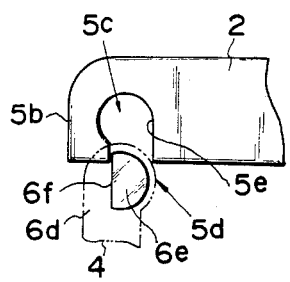
FIGS. 7A, 7B, and 7C are explanatory side views illustrating a process for coupling the locking lever and the IC socket by the coupling means of FIG. 6.
Figure 7C:
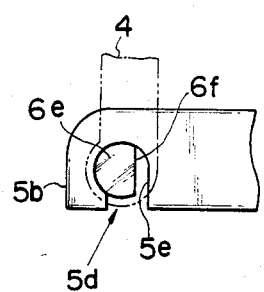
Figure 7B:
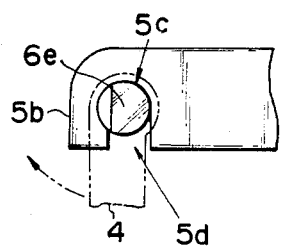

FIGS. 6 and 7A illustrate one embodiment of the second coupling means 4A, which is here shown connecting the locking lever member 4 and the socket 2.

As illustrated, the socket 2 is provided on the end thereof opposite to the end pivotally supporting the cover member 3 with bearing coupling means, and the locking lever member 4 is provided on the base end thereof with shaft coupling means. The bearing coupling means is comprised of two bearing couplings $5b$ which are spaced in the direction of the length of the axis of rotation of the locking lever member and provided with shaft holes $5c$ having their axes in alignment with each other. The shaft coupling means is interposed between the bearing couplings $5b$ and is prevented from being moved in the direction of the axes of the shaft holes $5c$ of the bearing couplings $5b$. Although the shaft coupling means is divided into two shaft couplings $6d$ in the illustrated embodiment, it may be formed as a single part. Likewise the construction can have the bearing coupling means interposed between the shaft couplings $6d$.

The bearing coupling $5b$ is provided with a shaft insertion port $5d$ which is provided in the bottom surface of the bearing coupling $5b$ and communicates with the shaft hole $5c$. The shaft insertion port $5d$ has a width smaller than the diameter and larger than the radius of the shaft hole $5c$. One inner wall $5e$ of the shaft insertion port $5d$ is aligned tangentially with the shaft hole $5c$ as illustrated in FIG. 7A.

The shaft couplings $6d$ provided on the base end of the locking lever member 4 have shafts $6e$ which project outwardly in opposite directions and are slidably fitted in the shaft holes $5c$. Where the bearing coupling means is interposed between the shaft couplings $6d$, as described hereinbefore, the shafts $6e$ project inwardly toward each other. Part of the shaft $6e$ has a width smaller than the radius of the shaft $6e$, being cut along the axis of the shaft $6e$ so as to give to the shaft a semicylindrical cross-sectional shape. The width of the shaft $6e$ from the cut surface $6f$ to the arc shaped surface through the axis thereof is substantially the same as or slightly smaller than the width of the shaft insertion port $5d$.

For assembly, the shafts $6e$ with the circular segmental cross-sectional shape are urged into the shaft insertion ports $5d$ from below and urged into the shaft holes $5c$ with the side walls of the shaft insertion ports $5d$ serving as guides. Subsequently, the locking lever member 4 is rotated toward the upper surface of the socket 2 for causing the cut surfaces $6f$ of the shafts $6e$ to be rotated within the shaft holes $5c$, with the result that the shaft couplings $6d$ and the bearing couplings $5b$ are rotatably united with each other. In this case, it is preferable for the shafts $6e$ to be inserted into the shaft holes 5c so that the cut surface 6f does not confront the aforementioned inner wall 5e of the shaft insertion port 5d in alignment with a tangential line of the shaft hole 5c. By rotating the locking lever member 4 in this state in the direction toward the upper surface of the socket 2 until the locking lever member 4 is disposed at right angles relative to the socket 2, the upper edge of the cut surface 6f comes into intimate contact with the inner wall of the shaft hole 5c which is on the extension line of the inner wall 5e of the shaft insertion port 5d and is apart from the surface of the inner wall 5e. Thus, the shafts 6e of the shaft bearings 6d are effectively prevented from being released from the shaft insertion holes 5d of the bearing couplings 5b. Further, since the width of the part of the shaft 6e is smaller than the radius of the shaft 6e, the shaft 6e still has a diametric portion. Therefore, the diametric portion of the shaft 6e having a cross-section of a circular segment can be slidably fitted in the diametric portion of the shaft hole 5c. That is to say, there is no fear of the shafts 6e being loose within the shaft holes 5c. The locking lever member 4 can be rotated smoothly so that the cover member 3 may be precisely locked by the locking lever member 4.

As with the bearing couplings 2b and shaft couplings 3b of the first coupling means 3A, the bearing couplings 5b and shaft couplings 6d can be reversed, the bearing couplings 5b being on the locking lever member 4 and the shaft couplings 6d being on the cover member 2. This arrangement is not illustrated.

Figure 8:
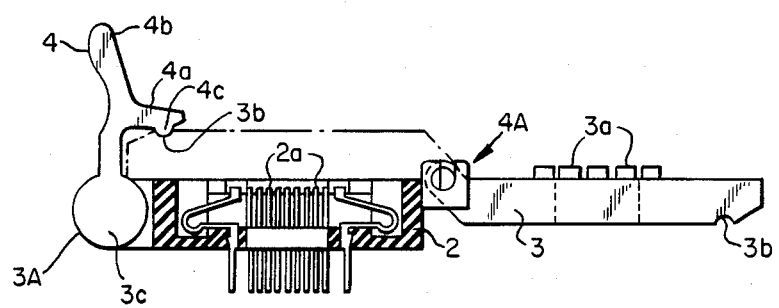
FIG. 8 is a view similar to FIG. 2 showing the first coupling means coupling the locking lever member and the socket and the second coupling means coupling the lid member and the socket.

As seen in FIG. 8, the coupling means 3A can be used to connect the locking lever member 4 to the socket, and the coupling means 4A can be used to connect the cover member to the socket. It will also be apparent that the coupling means 3A can be used to connect both the cover member and the locking lever member to the socket, or the coupling means 4A can be used to connect both the cover member and the locking lever member to the socket. Neither of these last two arrangements are illustrated.

According to the present invention, as described above, an IC package can be safely, precisely and firmly supported in an IC socket, thereby obtaining reliable electric connection.

What is claimed is:

1. A supporting structure for an IC package, which comprises:
   a socket for receiving an IC package;
   a cover member rotatably attached to one end of said socket;
   a locking lever member rotatably attached to the other end of said socket for locking the cover member to the socket when the cover member is in the closed position on the socket; and
   a first coupling means having:
   at least two bearing couplings projecting from one end of one of the socket and one of said members and spaced from each other in the direction of the axis of rotation of said one member and each bearing coupling having a hole therethrough in said direction;
   at least two shaft couplings projecting from the base end of the other of the socket and said one member and spaced from each other in said direction and each having a shaft which projects from the side thereof in the said direction; and
   at least two keys projecting from the base end of the one of said socket and said one member having the shafts thereon and disposed respectively at the free ends of the shafts;
   the two bearing couplings each having a key groove in the circumferential surface thereof parallel to the axes of said holes and adapted to have said keys slidably fitted therein.

2. A supporting structure as claimed in claim 1 in which said first coupling means is between said cover member and said socket.

3. A supporting structure as claimed in claim 1 in which said first coupling means is between said locking lever member and said socket.

4. A supporting structure as claimed in claim 1 in which said first coupling means is between said cover member and said socket and further comprising a further first coupling means between said locking lever member and said socket.

5. A supporting structure for an IC package which comprises:
   a socket for receiving an IC package;
   a cover member rotatably attached to one end of said socket;
   a locking lever member rotatably attached to the other end of said socket for locking the cover member to the socket when the cover member is in the closed position on the socket;
   a first coupling means having:
   at least two bearing couplings projecting from one end of one of the socket and one of said members and spaced from each other in the direction of the axis of rotation of said one member and each bearing coupling having a hole therethrough in said direction,
   at least two shaft couplings projecting from the base end of the other of the socket and said one member and spaced from each other in said direction and each having a shaft which projects from the side thereof in the said direction, and
   at least two keys projecting from the base end of the one of said socket and said one member having the shafts thereon and disposed respectively at the free ends of said shafts;
   the two bearing couplings each having a key groove in the circumferential surface thereof parallel to the axes of said holes and adapted to have said keys slidably fitted therein; and
   a second coupling means having:
   a bearing coupling means projecting from one end of one of the socket and the other of said members and having a hole therethrough in the direction of the axis of rotation of said other member and a shaft insertion port opening out of said hole, said insertion port having a width less than the diameter and greater than the radius of said hole, and
   a shaft coupling means projecting from the base end of the other of said socket and said other member and having a shaft means which projects from the side thereof in the said direction and having a semicylindrical cross-sectional shape for being insertable into said insertion port and having the semicylindrical surface thereof rotatable in intimate contact with the surface defining said hole.

6. A supporting structure as claimed in claim 5 in which said first coupling means is connected between said cover member and said socket and said second coupling means is connected between said locking lever member and said socket.

7. A supporting structure as claimed in claim 5 in which said first coupling means is connected between said locking lever member and said socket and said second coupling means is connected between said cover member and said socket.

* * * * *